United States Patent [19]

Holden

[11] Patent Number: 4,703,507
[45] Date of Patent: Oct. 27, 1987

[54] NOISE REDUCTION SYSTEM

[76] Inventor: Thomas W. Holden, 507 South Washington St., Beverly Hills, Fla. 32665

[21] Appl. No.: 890,617

[22] Filed: Jul. 25, 1986

Related U.S. Application Data

[63] Continuation-in-part of Ser. No. 596,891, Apr. 5, 1984, abandoned.

[51] Int. Cl.$^4$ .................... H04B 1/10; H04B 15/00
[52] U.S. Cl. .................................. 381/94; 455/223; 455/225; 455/221
[58] Field of Search ............... 455/225, 221, 222, 223, 455/302, 303, 304, 305, 306; 381/94

[56] References Cited

U.S. PATENT DOCUMENTS

| | | | |
|---|---|---|---|
| 3,478,268 | 11/1969 | Coviello | 455/306 |
| 3,493,871 | 2/1970 | Mason et al. | |
| 3,818,362 | 6/1974 | Van Sluys | 328/167 |
| 3,928,721 | 12/1975 | Holden | 333/70 R |
| 3,973,210 | 8/1976 | Holden | 328/167 |
| 4,220,926 | 9/1980 | Buckner | 328/165 |
| 4,232,381 | 11/1980 | Rennick et al. | 381/94 |
| 4,272,846 | 6/1981 | Muratani et al. | 455/296 |
| 4,414,689 | 11/1983 | Enderson | 455/225 |
| 4,461,025 | 7/1984 | Franklin | 381/94 |
| 4,495,643 | 1/1985 | Orban | 381/94 |

Primary Examiner—Forester W. Isen
Attorney, Agent, or Firm—Macdonald J. Wiggins

[57] ABSTRACT

A noise reduction system and method for reducing noise occurring during pauses in information bearing audio signals has an audio input connected to one input of a differential output circuit. A variable gain circuit has an input connected to the audio input and an output connected to the other input of the differential circuit. A dc control signal is derived from the incoming signals and controls the variable gain circuit to cause cancellation of a noise only signal during periods of no information bearing audio signals.

12 Claims, 6 Drawing Figures

NOISE REDUCTION SYSTEM

This application is a continuation-in-part of co-pending application Ser. No. 596,891, now abandoned, filed 4/5/84.

BACKGROUND OF THE INVENTION

1. Field of the Invention

The present invention relates to noise reduction in radio receivers and the like, and in particular, a noise reduction system for reducing noise during intervals between intelligence-carrying signals.

2. Description of the Prior Art

In the area of radio communications, the limiting factor in recovering intelligence from a modulated radio frequency signal is the presence of noise. This noise occurs in a number of forms. Effective methods for reduction of noise are known for some types of noise. For example, sharp impulse noise, such as from ignition and other pulse-like sources, is commonly reduced by blanking for a short interval which would normally have a negligible effect on the intelligence of the modulated signal. However, thermal noise, which generally has a uniform frequency distribution tailored by the response curves of the receiving system, and atmospheric noise is not susceptible to this type of noise reduction scheme. Even when such noise is at a relatively low level, it causes fatigue of the listener and detracts from the overall intelligibility of the signal.

Peaks of noise occurring during the presence of intelligence signals can be reduced somewhat with clippers and limiters, but excessive clipping will distort the intelligence signals and thereby reduce the intelligibility thereof. A significant portion of the disturbing noise may well occur in short intervals during which no intelligence is being received. An example is between words, sentences and syllables or between pulses in Morse code CW systems. Thus, it is apparent that an improvement in the signal may be made without significantly affecting intelligibility by eliminating or greatly reducing the noise amplitude during such intervals.

In U.S. Pat. No. 3,973,210 to Holden, a system is described which reduces noise between signal envelopes by phase displacement between noise envelopes and the original composite signal envelopes at the input of an audio circuit. While this system has proved helpful for reception of CW or Morse code type signals, it is not suitable for reception of audio modulated signals because noise modulates the audio signal as well as being superimposed on it. Thus, there is a need for a system which will reduce the intersyllabic and word interval noise in a modulated audio signal to reduce fatigue of the listener and to increase the intelligibility of the audio signals.

SUMMARY OF THE INVENTION

The present invention is a system which may be inserted between the audio output of a radio receiver and the audio amplifier and audio transducer thereof. In the invention, the incoming audio signal is split into two paths. A first path carries the composite signal which will comprise a varying intelligence carrying audio component plus thermal and atmospheric noise. This channel is passed through a phase or delay adjustment circuit to one input of a differential output circuit. The second channel is passed to an envelope detector, which may be any conventional known type, to produce a slowly varying dc signal representative of the envelope of the audio signal plus noise. Generally, this is accomplished by a rectifier followed by a low pass filter. As will be understood, the low pass filter will cut off at a frequency near the desired intelligence carrying signal lower envelope repetition frequency limit. For example, a cutoff frequency in the neighborhood of 150 cycles is satisfactory.

As may be understood by those of skill in the art, during a period in which the composite audio signal is carrying intelligence, this intelligence will have the noise present superimposed thereon. Assuming a reasonable signal-to-noise ratio, such signal will have a relatively large dc envelope. However, at a point in time at which the intelligence carrying portion of the audio signal is at a low amplitude and the noise amplitude exceeds the signal amplitude, the dc envelope signal will have a lower amplitude than the intelligence plus noise envelope. This is true since the syllabic and word rate of speech is relatively slow and therefore the transition from a syllable to an intersyllabic space will be passed by the low pass filter.

As will now be recognized, the slowly varying dc envelope signal will have a relatively high amplitude during intelligence portions of the signal and a relatively low amplitude during intersyllabic or word spacing intervals.

Returning to the first channel, the signals from the first channel are also fed through an electronically controlled variable gain circuit to the opposite input of the differential output circuit previously mentioned. When the gain of the variable gain circuit is high, the two signals into the differential device will be essentially the same amplitude and of the same polarity and will tend to cancel. However, when the output of the variable gain circuit gain is low, slightly less cancellation will take place but a small portion of the signal and noise in the first channel will appear at the output of the differential device to be processed by the following audio amplifier and transducer. To reduce the intersyllabic noise, the slowly varying dc envelope from the second channel is utilized as a control signal to slightly reduce the gain of the variable gain circuit during the portion of the signal carrying intelligence and to sligtly increase the gain when the signal is only intersyllabic or noise. Thus, when the gain is high, the noise present on the second input of the differential device will essentially cancel with the same noise in the first channel, producing a very low noise output. As will be understood, the phase or delay adjustment previously mentioned is utilized to correct for phase shifts through the variable gain circuit. The invention may be designed to function if the dc control is used to increase the gain of a variable gain circuit. It may also be understood that the noise burst repetition rates can generally be expected to be at a higher rate than the syllabic rate of speech. Therefore, due to the low pass filter, a relatively constant low value dc control voltage is generated.

It will be understood that the amplitude of the output of the previously mentioned envelope detector is controlled by the amplitude and envelope repetition frequency of the input to the envelope detector. Thus, when the invention is adjusted to cancel noise, which has a relative high envelope repetition frequency, the syllables, having a much lower envelope repetition frequency, will be attenuated less by the envelope detector and the differential output circuit will not be balanced thereby allowing the syllables to be reproduced at the output terminals with noise superimposed on them but not between them.

although the invention has been described above with reference to audio signals, it will be noted that the invention is equally applicable to higher frequency signals carrying intelligence bearing signals. For example, the invention will operate at the intermediate frequency of a superheterodyne receiver.

It is therefore a principal object of the invention to provide a noise reduction system which utilizes the difference between the noise envelopes of signal plus noise and noise to permit cancellation of noise during intersyllabic and word spacing intervals.

It is another object of the invention is to provide a first channel carrying an audio plus noise signal which is connected to one input of a differential output circuit and to the opposite input via a variable gain circuit and to control the gain of the variable gain circuit to be high when noise only is present and to be low when signal and noise are both present.

It is still another object of the invention to provide a system for utilizing a signal plus noise envelope to permit the signal plus noise signal to pass through the system and to permit a noise envelope to cause a noise only signal to be cancelled when present.

It is yet another object of the invention is to provide a channel carrying audio plus noise signal which is connected to a differential output circuit via a variable gain circuit and to control the gain of the system to be low when only noise is present and to be high when signal and noise are both present.

These and other objects and advantages of the invention will become apparent from the following detailed description when read in conjunction with the drawings.

DETAILED DESCRIPTION OF THE PREFERRED EMBODIMENT

Figure 1:
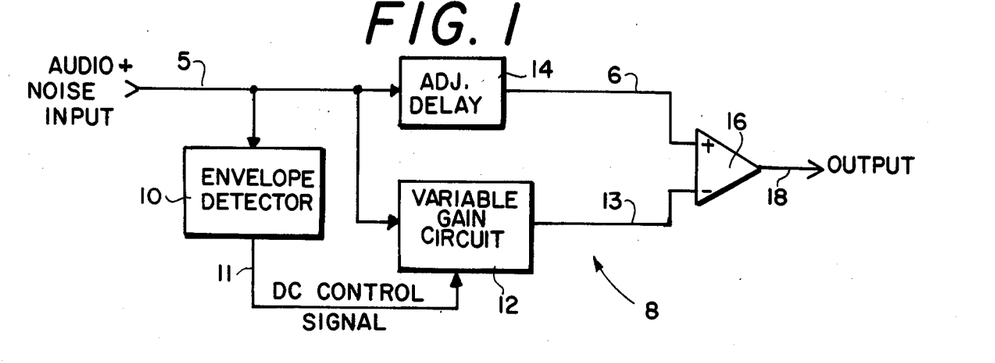
FIG. 1 is a simplified block diagram of the invention to show the principle of operation thereof.

Referring to FIG. 1, a greatly simplified block diagram of the noise reduction device of the invention is shown to indicate the principle of operation thereof. The device is preferably connected between a point in a receiving system at which demodulated audio is available and ahead of the audio amplifying and reproducing portion of the receiver. Thus, on input line, lead 5, an audio signal plus noise, which may be thermal noise, atmospheric noise and other random interference-type noise, is present. The path for the audio signal plus noise is from lead 5 via an adjustable delay or phasing circuit 14 to lead 6 which connects to one input of a differential device 16. Device 16 may be a differential amplifier, a tapped transformer, or a potentiometer. Preferably, a potentiometer is used, as will be shown hereinbelow. The output of differential device 16 on lead 18 connects to the audio amplifier and reproducing portion of the receiver.

It will be recognized at this point that if there is no signal on lead 13 connected to the opposite input of differential device 16, then the audio and noise signal on lead 5 will appear on output lead 18. However, when a signal is present on the opposite input 13, the output will be the difference between the two signals.

In accordance with the invention, envelope detector 10 is connected to lead 5 and will produce a dc output on lead 11 proportional to the envelope amplitude of the audio and noise signal within the passband of the detector 10. This dc output will be utilized as a control signal in the operation of the invention. A variable gain circuit 12 has an input connected to lead 5 and an output on lead 13. Variable gain circuit 12 may be initially adjusted with noise only on input lead 5 so as to pass the noise without attenuation. Differential output circuit 16 will therefore normally have an output on lead 18 which would be the difference between the noise signal on lead 6 and the same noise signal of about the same amplitude on lead 13. Therefore, the noise would effectively cancel. The dc control signal on lead 11, when applied to variable gain circuit 12, will, when audio is present on lead 5, control variable gain circuit 12 to a low gain or attenuated condition. However, when there is no audio signal present and only noise is found on lead 5, the dc control signal on lead 11 will be low and cause the gain of variable gain circuit 12 to increase, producing a noise output on lead 13 approximately equal to the noise on lead 6. The polarity of the signal on lead 13 is controlled to be essentially in phase with the signal on lead 6. Adjustable delay circuit 14 may be adjusted to compensate for the delay through variable gain circuit 12 to ensure that the noise signals on leads 6 and 13 are essentially in phase. Adjustable delay circuit 14 may be eliminated it the phase shift introduced by the variable gain circuit 12 is essentially zero. As will now be understood, when the gain of circuit 12 is controlled such that the noise signal on lead 13 is equal in amplitude and in phase to the noise signal on lead 6, the noise signals will cancel out in differential device 16 and no output will occur on lead 18.

The amplitude of the dc control signal on lead 11 is determined by the amplitude and envelope repetition frequencies of the signal and noise envelopes on lead 5. For a given input amplitude on lead 5, the dc control on lead 11 will increase as the envelope frequencies decrease. Noise energy having relative high frequency envelopes will produce a low amplitude dc control signal, causing noise cancellation. An audio signal, such as syllables, for example, have relative low frequency envelopes and produce a high amplitude dc control signal and complete cancellation will not occur.

Figure 2:
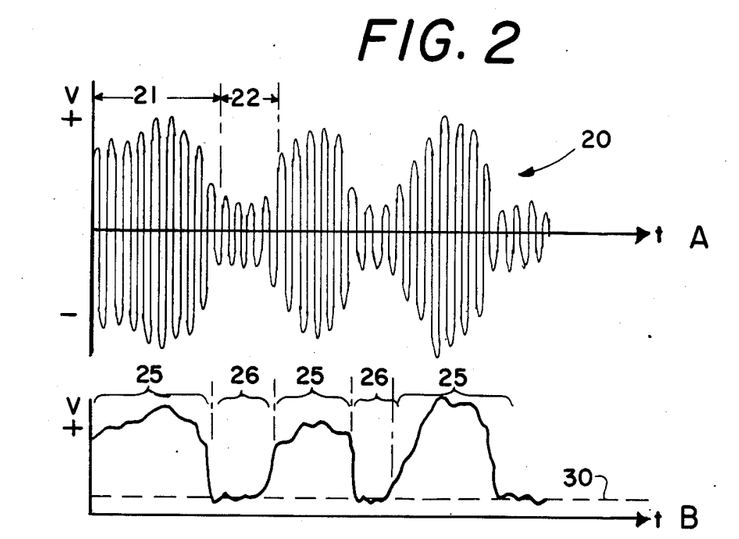
FIG. 2 shows waveform diagrams of an audio signal plus noise and the detected envelope of such signal.

Details of operation of the circuit of FIG. 1 are best explained with reference to FIG. 2 which on line A shows a typical audio plus noise signal occurring on lead 5. Assuming that signal 20 is a voice plus noise signal, then the signal present during interval 21 may be a syllable of a word plus noise. The signal present in interval 22 is predominantly noise when the speech or voice energy is very low between syllables. Thus, the audio plus noise portion of the signal will have a higher amplitude than the noise only portion of the signal and generally will have a lower frequency envelope. When signal 20 is passed through envelope detector 10, a slowly varying dc envelope signal 23 seen on line B of FIG. 2 will occur on output lead 11 and represents the dc control signal for variable gain circuit 12. Thus, during the presence of voice and noise information in interval 21, a high amplitude dc control signal 25 is applied to variable gain circuit 12, reducing the gain thereof such that an attenuated voice signal plus noise signal is present on lead 13. However, on lead 6, the full amplitude voice signal plus noise will be present. Therefore, the output from differential device 16 on lead 18 will be a faithful reproduction of the audio plus noise input on lead 5.

During interval 22, it will be noted from the waveform 23 on line B that the dc control signal 26 is low and therefore the gain of variable gain circuit 12 will increase. The gains in the circuit of the invention are initially adjusted such that when dc control signal 30 seen on line B is applied to variable gain circuit 12, the ac noise signal on lead 13 will be essentially equal to and in phase with the noise signal on lead 6. Therefore, the two noise signals will essentially cancel in differential device 16. It will be noted that the passband of envelope detector 10 must be such as to follow the highest rate of repetition of the voice syllables to prevent clipping of the voice signal when preceding and following intersyllabic intervals where no audio or intelligence is present. It will also be recognized that, in general, the rate of repetition of the speech variations will be much slower than that of the noise in which high frequency bursts generally predominate. Therefore, the envelope detector will pass the syllabic variations while the noise alone will produce a relatively smooth dc control signal as indicated on line 30 of FIG. 2, since the higher frequency envelopes of the noise are greatly attenuated by the envelope detector filter.

Figure 3:
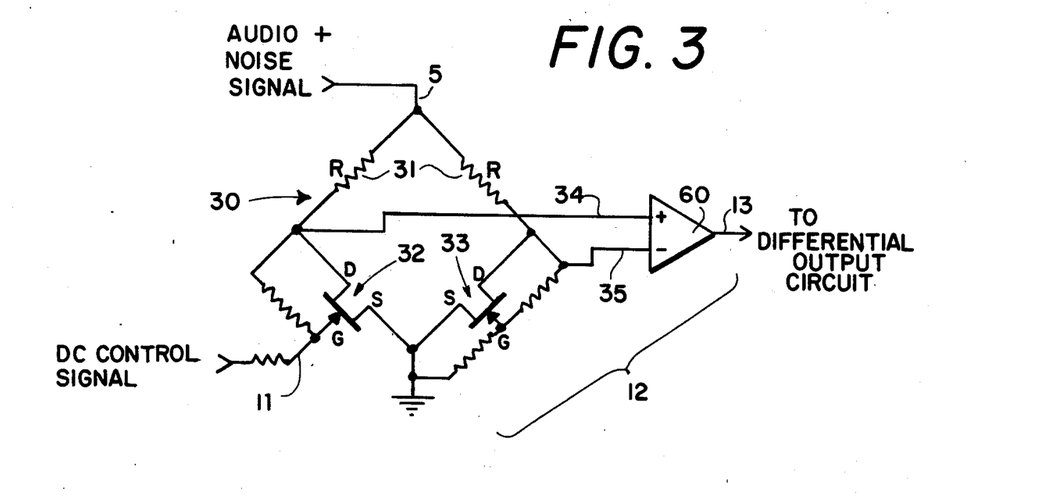
FIG. 3 shows a simplified diagram of the variable gain circuit of FIG. 1.

As may now be understood, the invention requires a variable gain circuit 12 which may be controlled by a dc control signal and preferably is relatively linear over its range, and which will have a lower output when the control signal is high. Figure 3 shows a simplified diagram of a preferred variable gain circuit 12. A bridge circuit 30 is provided having two resistance legs 31 in which resistors 31 are of equal value. The opposite legs 32 and 33 are formed from voltage controlled, variable resistance devices. While many such devices are known in the art, it is preferred to use a junction field effect transistor (JFET) for this purpose. JFET 33 is provided with a fixed bias and therefore will have an essentially constant resistance. JFET 32 has the dc control signal from lead 11 attached to its gate or control electrode.

The audio plus noise signal on lead 5 is fed to the top connection of bridge 30 with the bottom connection grounded. If the bridge were perfectly balanced, then there would be no output across the other two terminals of the bridge on leads 34 and 35. However, if the bridge becomes unbalanced, then an output will occur across leads 34 and 35. The values of the resistance in bridge 30 and the biasing voltages on JFETs 32 and 33 are therefore selected such that when the dc control signal on lead 11 is low, bridge 30 is unbalanced and a relatively high output will appear on leads 34 and 35. When a large dc control signal appears on lead 11, bridge 30 will be controlled toward the balanced condition and the output between leads 34 and 35 will be attenuated. Thus, referring to line B of FIG. 2 when the intelligence bearing portion of signal 20 is present, the dc control signal, for example signal 25, will be high and JFET 32 will be controlled to have a resistance between its drain terminal and source terminal which will tend to balance the bridge 30. Therefore, the audio plus noise signal on lead 5 will appear attenuated across leads 34 and 35. When only noise is present such as during intervals 26, the resistance of JFET 32 in response to a low control voltage 30 will drop, unbalancing the bridge and the noise signal present during that inverval on lead 5 will appear between leads 34 and 35. A differential amplifier 60 has its inputs connected to leads 34 and 35 and therefore will produce an output on lead 13 equal to the difference in voltages on lead 34 and 35. The gain of differential amplifier 60 is selected to amplify the noise signal to be essentially equal to the noise signal on lead 5. When the intelligence plus noise signal is present on lead 5, there will be an attenuated intelligence plus noise signal present on lead 13. When only noise is present on lead 5, bridge 30 will be unbalanced and a relatively high noise signal potential will appear between leads 34 and 35 and a high noise output signal will appear on lead 13.

Figure 4:
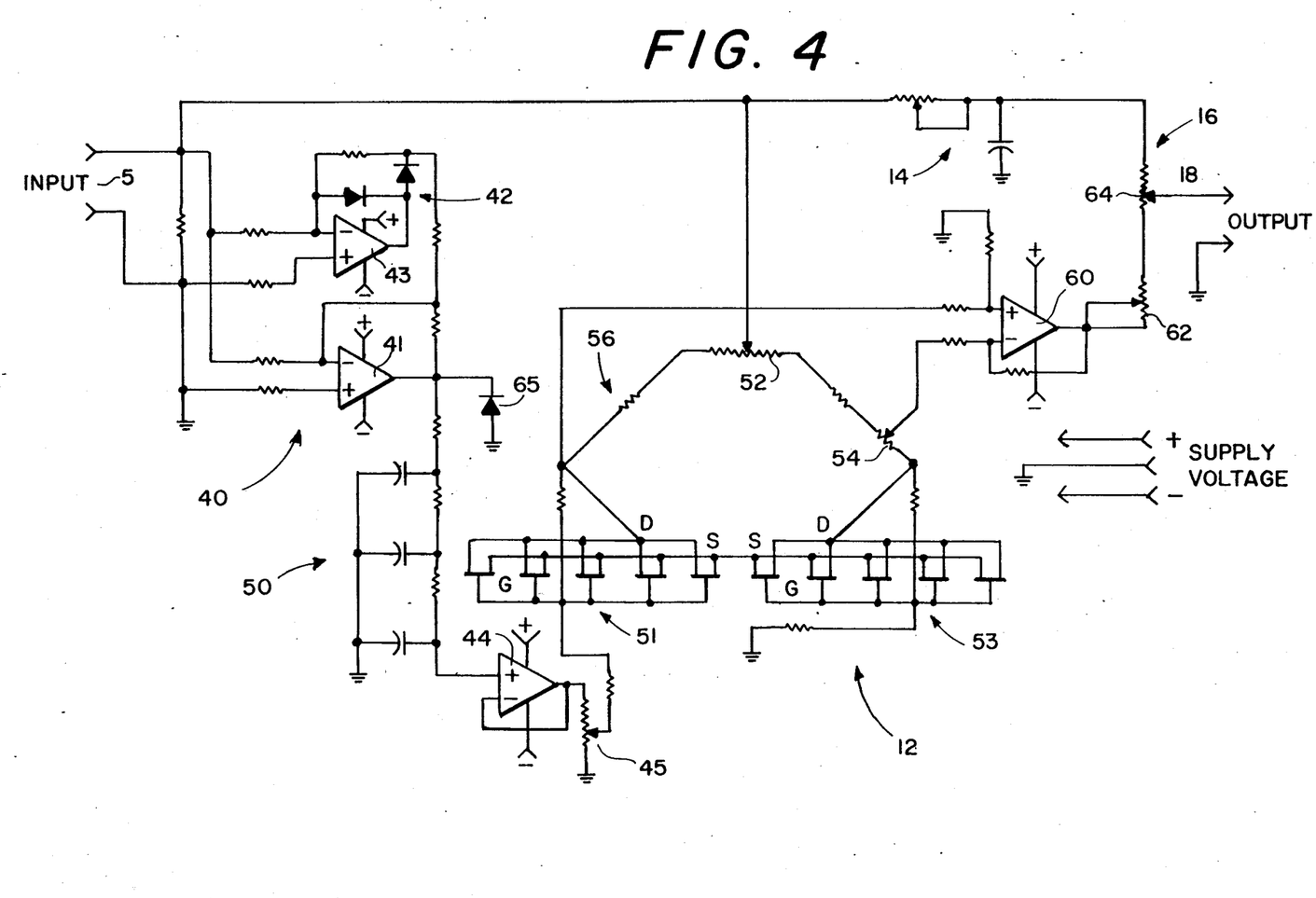
FIG. 4 is a schematic diagram of a preferred embodiment of the invention.

In FIG. 4, a schematic diagram of the preferred embodiment of the invention is shown. Audio input 5 is connected via adjustable delay network 14 to differential output circuit 16 comprising a potentiometer 64 and variable resistor 62. The audio input signal of input 5 is also fed to full wave rectifier 40. Although any type of rectifier circuit is suitable, an effective low cost circuit may be formed with operational amplifiers 41 and 43 and diodes 42. Amplifiers 41 and 43 are preferably a dual type 741. Diode 65 acts as a control voltage limiter. The output of rectifier 40 is fed to a low pass filter 50. Any type of low pass filter circuit may be used; however, as shown, a three stage RC filter is eminently suitable. The slowly varying dc output from filter 50 is connected to a buffer amplifier 44 which may also be a type 741 operational amplifier. Variable gain circuit 12 is implemented with the novel bridge circuit 56 of the type shown in FIG. 3. To provide controls for adjusting and balancing the system, the audio from input 5 is fed into bridge circuit 56 by potentiometer 52. The control leg of bridge 56 is implemented with a plurality of parallel JFETs 51. Type MPF 102's are suitable for this use in which instance, a negative-going control voltage is used. The parallel connections provide a controllable resistance having good linearity. Similarly, a second set of five identical JFETs 53 is connected in parallel in the adjacent leg. The two output leads 34, 35 from bridge 56 are connected to differential amplifier 60 which may be a type LF 357 with one input taken from potentiometer 54 to permit initial unbalancing of the bridge 56. The output from differential amplifier 60 is connected via variable resistor 62 to the lower end of potentiometer 64.

Alternatively, the bridge circuit 56, shown in FIG. 4, may be adjusted to produce an increase in gain in response to the dc control signal by adjusting potentiometer 52 until the bridge circuit 56 is adjusted through the point of balance. The input leads to differential amplifier 60 are, in such case, interchanged in order to maintain the proper phase at the output of the differential amplifier 60.

The components of low pass filter 50 are selected to have a cutoff frequency in the range of 100 Hz. It will be recognized that this value may be modified depending on the envelope frequency of the desired audio signals to be received.

Having described the circuit of FIG. 4, the method of adjusting the circuit will now be discussed. To initially adjust the bridge circuit 56, the output from the low pass filter 50 of the envelope detector is reduced to zero by setting the wiper of potentiometer 45 to the ground end. The wiper of potentiometer 54 is moved to the end connected to the drain terminals D of JFETs 53. Potentiometer 52 is approximately centered and variable resistor 62 is set to the approximate center. At this point, a source of noise of the type to be reduced is connected to input 5. Output 18 is connected to a suitable monitor such as an audio amplifier and speaker, oscilloscope, or an ac volt meter. As will be noted, bridge 56, at this point, is essentially balanced and there should be little or no output from differential amplifier 60. The output from differential amplifier 60 is therefore monitored and potentiometer 52 adjusted until the output is minimum. Potentiometer control 54 is then moved away from the JFET drain connection which will begin to unbalance bridge 56. This causes noise voltage to appear at the output of amplifier 60. Balance control 64 is then adjusted for minimum noise output on leads 18.

Next, delay circuit 14 is adjusted to obtain a null by bringing the noise at the upper end of balance control 64 180 degrees out-of-phase with the noise voltage at the opposite end thereof. It is noted that variable resistor 62 preferably has a maximum resistance about 1/20th the resistance of balance control 64 and is used as a vernier balance control. After setting control 64 to an approximate null, variable resistor 62 may be adjusted to obtain the deepest null for the noise voltage at output 18. The noise signal is then removed from input 5 and an audio signal with noise is applied thereto. Control 45 is moved off from its ground position to provide a control voltage to variable resistance JFETs 51. The dc voltage present at control 45 will control the resistance of JFETs 51 to tend to bring bridge 56 into balance and therefore reduce the output from differential amplifier 60. It is necessary to iteratively adjust bridge balance control 54, dc voltage control 45 and output control 64 to produce the most effective operation of the circuit.

After such adjustment, when the audio intelligence bearing signal is present at input 5, the control voltage will tend to bring bridge 56 toward balance and an attenuated portion of the audio plus noise signal appears at the output of differential amplifier 60. Therefore, a maximum audio signal will appear at output 18. When the audio ceases or drops to a very low amplitude, the intersyllabic noise will produce a much lower control voltage at JFETs 51 causing the bridge to become more unbalanced and the noise output at the output of differential amplifier 60 will then be approximately the same amplitude as at the upper end of balance control 64 and 180 degrees out-of-phase, causing cancellation of the noise.

In tests of the noise reduction device of the invention, it has been found that the unit is effective on both voice and CW signals to effectively blank out noise between intelligence bearing audio signals with the result that the overall reception of noise on the part of the listener is greatly reduced. Thus, not only is the intelligibility of the information increased but the fatigue on the part of the listener is reduced. The system is also effective on music and appears to the listener as reduced background noise but with minimum effect on the music itself.

As will be recognized by those of skill in the art, the basic circuit described above is effective only in reducing noise in pauses between syllables or intelligence bearing signals and is not effective on noise that is present during the intelligence portion of the signal. However, the noise reduction circuit of the invention may be utilized in a circuit shown in simplified form in FIG. 5 to also reduce noise occurring during intelligence bearing portions of the signal. This is accomplished by combining a set of bandpass filters 70, 72 through 74 in parallel, with each bandpass filter followed by a noise reduction circuit 8. The outputs of the noise reduction circuits 8 are fed to a mixer 76 to produce the desired output signal. Each bandpass filter will have a different pass band with the bands overlapping as shown by the attenuation diagram of FIG. 6.

Figure 5:
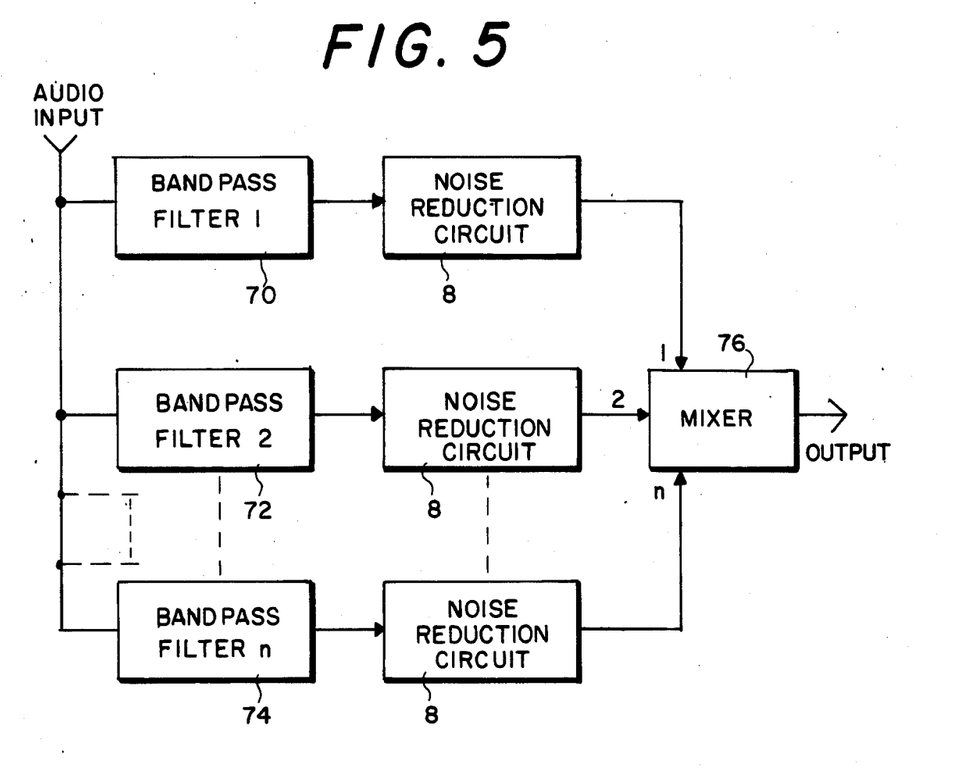
FIG. 5 is a block diagram of a system in accordance with the invention which will provide improved noise reduction with minimum distortion of the desired signal.
Figure 6:
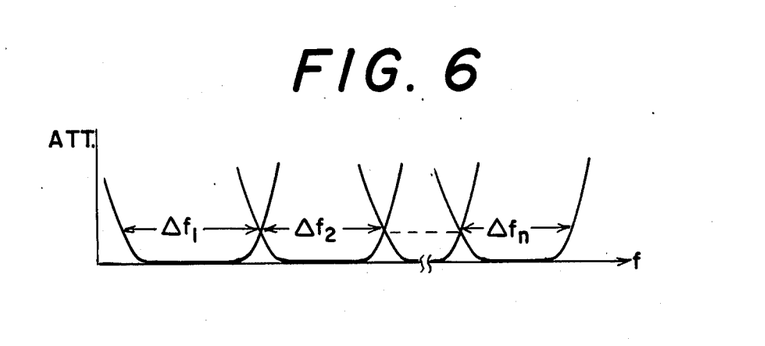
FIG. 6 shows the typical attenuation curves of the bandpass filters of FIG. 5.

For example, bandpass filter 1 (70) may have a passband of $f_1$; bandpass filter 2 (72) may have bandpass of $\Delta F_2$ and so on to bandpass filter n (74) having a pass band of $\Delta f_n$. In utilizing the invention to reduce noise for musical material, the audio band of the music would be broken into a desired number of successive bands, with each set of bandpass filters and noise reduction circuits then being effective to reduce the noise appearing in that respective frequency band when its amplitude is significantly lower than that of the audio material in that band. The composite signal for mixer 76 then will include essentially all of the original music frequencies but with each interval having low or no audio for each passband having the noise within that pass band cancelled for that particular interval. The system of FIG. 6 may also be used with voice to improve the intelligibility and reduce annoying background noises.

Having now described a basic noise reduction circuit and a system having overlapping bandpass circuits, it is to be understood that these specific circuits are for illustrative purposes only. It will be obvious to substitute other circuit elements to perform the same functions in the same way and such modifications are considered to fall within the spirit and scope of the invention.

I claim:

1. A noise reduction system for connection to the output of a radio receiver or the like comprising:

a signal input for receiving an intelligence plus noise signal or a noise only signal;

a differential output circuit having a first input connected to said signal input;

an envelope detector connected to said signal input for producing a slowly varying do control signal proportional to the envelope of the intelligence and noise signals at said signal input; and a variable gain circuit including a bridge circuit having a pair of input terminals connected to said signal input and a pair of output terminals, said bridge having a controllable resistance in one leg thereof, said controllable resistance operatively connected to said envelope detector for receiving said do control signal whereby said controllable resistance is varied to vary the balance of said bridge circuit, and a differential amplifier having a pair of differential input terminals connected to said bridge output terminals and an output terminal connected to a second input of said differential output circuit, said differential amplifier having a high output when said bridge is greatly unbalanced and a low output when said bridge approaches balance, said do control signal applied to said variable gain circuit for controlling the gain thereof, said variable gain circuit controlled to produce an output signal at said second input of said differential output circuit essentially equal in amplitude and phase to a signal at said first input thereof when a noise only signal is present at said signal input and to produce an output signal at said second input of said circuit differing in amplitude from a signal at said first input thereof when an intelligence plus noise signal is present at said signal input.

2. The system as recited in claim 1 which said envelope detector includes:
a rectifier; and
a low pass filter having a cutoff frequency low with respect to the audio frequency content of an audio signal at said signal input and high with respect to the frequency of the envelope of said audio signal.

3. The system as recited in claim 1 in which said envelope detector includes:
a rectifier; and
a low pass filter having a cutoff frequency low with respect to the audio frequency content of an audio signal at said signal input and low with respect to the frequency of the envelope of said noise signal.

4. The system as recited in claim 1 in which said controllable resistance is a field effect transistor.

5. The system as recited in claim 1 in which said controllable resistance is a plurality of field effect transistors connected in parallel.

6. The system as recited in claim 1 in which said differential output circuit includes a potentiometer having a movable arm, said movable arm connected to said noise reduction system output.

7. The system as recited in claim 1 in which said first input is connected to said signal input via an adjustable delay circuit.

8. The system as recited in claim 7 in which said adjustable delay circuit is a phase shift network.

9. In a communications receiver, a system for cancelling noise signals occurring during pauses in an information bearing signal comprising:
(a) a plurality of bandpass filters, each having an input and an output, the bandpasses of said filters overlapping such that a total bandpass of said filters encompasses the passband of said information bearing signals;
(b) a plurality of noise cancelling subsystems wherein one of said subsystems is connected to the output of each of said plurality of bandpass filters, each of said noise cancelling subsystems having
(i) a subsystem input for receiving information bearing signals plus noise signals from one of said bandpass filters.
(ii) a differential output circuit having first and second inputs, and a noise cancelling subsystem output,
(iii) an adjustable delay having an input connected to said subsystem input and an output connected to said first input of said differential output circuit,
(iv) a variable gain circuit having a signal input connected to said subsystem input, a signal output connected to said second input of said differential output circuit, and a control input for de control signal for varying the gain of said variable gain circuit,
(v) a rectifier connected to said subsystem input, and
(vi) a low pass filter having an input connected to said rectifier for filtering a varying dc voltage from said rectifier, thereby providing a dc control voltage proportional to the envelopes of said information bearing signals and said noise signals, said low pass filter having an output connected to said control input of said variable gain circuit, said variable gain circuit causing the noise signal at said second input of said differential output circuit to be essentially equal in amplitude to the noise signal at said first input thereof when said dc control signal amplitude is low during such pauses and to cause the information bearing signals at said second input to differ in amplitude relative to the information bearing signal at said first input; and
(c) a mixer circuit having a plurality of mixer inputs wherein one of said mixer inputs is connected to the output of each of said noise cancelling subsystems, said mixer having a mixer output circuit for the information bearing audio signal within said total bandpass.

10. In a communication system for reception of intelligence bearing signals plus thermal and atmospheric noise signals in which such intelligence bearing signals include periods of relatively low amplitude, the method of reducing the amplitude of said noise signals during such periods comprising the steps of:
producing a dc control signal from said intelligence bearing plus thermal and atmospheric noise signals having a slowly varying amplitude proportional to the envelope of said intelligence bearing plus thermal and atmospheric noise signals when present and proportional to the envelope of said thermal and atmospheric noise signals when the amplitude of said intelligence bearing signals is low;
passing said dc control signal through a low pass filter having a cutoff frequency low with respect to the frequency of said intelligence bearing signal and high with respect to the lowest frequency components of the envelopes of said intelligence bearing signals, said cutoff frequency low with respect to the lowest frequency components of the envelopes of said thermal and atmospheric noise signal;
applying said intelligence plus thermal and atmospheric noise signals to a first input of a differential output circuit and to a controllable gain circuit, the output of said controllable gain circuit is connected to a second input of said differential output circuit;
controlling the gain of said controllable gain circuit to be proportional to the amplitude of the dc control signal from said low pass filter to thereby cause the thermal and atmospheric noise only signal to the second input of the differential output circuit when such noise only signal is present to be essentially equal in amplitude to the thermal and atmospheric noise signal at the first input thereof to cause cancellation of the thermal and atmospheric noise only signal in the output circuit; and
controlling the gain of said controllable gain circuit proportional to the amplitude of the dc control signal from said low pass filter to thereby cause the intelligence plus thermal and atmospheric noise signal to the second input of the differential output circuit when such intelligence plus thermal and atmospheric noise signal is present to differ in amplitude from the intelligence plus thermal and atmospheric noise signal at the first input thereof to cause an intelligence plus thermal and atmospheric noise signal to be present at the output of said communication system.

11. A thermal and atmospheric noise reduction system for connection to the audio of a radio receiver or the like, in which audio signals therefrom include short periods of thermal and atmospheric noise only, for reduction of such noise during such periods comprising:
- a signal input for receiving alternately an audio plus thermal and atmospheric noise signal and a thermal and atmospheric noise only signal;
- a differential output circuit having a first input connected to said signal input, and a second input;
- a variable gain circuit having an input connected to said signal input and having an output connected to said second input of said differential output circuit, said variable gain circuit controllable by a dc control signal; and
- an envelope detector connected to said signal input for producing a slowly varying dc control signal proportional to the envelope of the audio and thermal and atmospheric noise signals at said signal input, said dc control signal applied to said variable gain circuit to control the gain thereof, said variable gain circuit controlled to produce an output signal at said second input of said differential output circuit essentially equal in amplitude and phase to a signal at said first input thereof when a thermal and atmospheric noise only signal is present at said signal input and to produce an output signal at said second input of said differential output circuit differing in amplitude from a signal at said first input thereof when an audio plus thermal and atmospheric noise signal is present at said signal input.

12. A thermal and atmospheric noise reduction system for connection to the output of a radio receiver or the like, in which desired signals therefrom include short periods of thermal and atmospheric noise only, for reduction of such noise during such periods comprising:
- a signal input for receiving alternately a desired signal plus thermal and atmospheric noise signals and thermal and atmospheric noise only signals;
- an output circuit means having a first input connected to said signal input for receiving input signals therefrom, a second input for receiving modified said input signals, and an output;
- amplifier circuit means for amplifying signals at said signal input and having an input connected to said signal input and having an output connected to said second input of said output circuit means, said amplifier circuit means having its gain controllable by a dc control signal; and
- detector means connected to said signal input for producing a slowly varying dc control signal proportional to the envelope of the desired signal and thermal and atmospheric noise signals at said signal input, said dc control signal applied to said amplifier circuit means to control the gain thereof, said amplifier circuit means controlled to produce said modified input signals at said second input of said output circuit means in opposing relationship in amplitude and phase to said input signals at said first input thereof when thermal and atmospheric noise only signals are present at said signal input for cancelling said noise only signals at said output circuit means output, and to produce an output signal at said second input of said output circuit means differing in amplitude from a signal at said first input thereof when a desired signal plus thermal and atmospheric noise signal is present at said signal input.

* * * * *

UNITED STATES PATENT AND TRADEMARK OFFICE
CERTIFICATE OF CORRECTION

PATENT NO. : 4,703,507

DATED : 10/27/87

INVENTOR(S) : Thomas W. Holden

It is certified that error appears in the above-identified patent and that said Letters Patent is hereby corrected as shown below:

In the Drawings:

In Figure 4, add a connection from the sources S of FET's 51 and 53 to ground.

In the Specification:

Column 2, line 1, change "de" to --dc--;
line 44, change "sligtly" to --slightly--.

In the Claims:

Claim 1, line 46, change "do" to --dc--;
line 54, change "do" to --dc--; and
line 64, change "do" to --dc--.

Claim 9, line 60, change "de" to --a dc--.

Signed and Sealed this

Seventeenth Day of May, 1988

Attest:

DONALD J. QUIGG

*Attesting Officer*   *Commissioner of Patents and Trademarks*